US008427345B2

(12) United States Patent
Shi et al.

(10) Patent No.: US 8,427,345 B2
(45) Date of Patent: Apr. 23, 2013

(54) SIDE KEYPAD ASSEMBLY AND PORTABLE ELECTRONIC DEVICE USING THE SAME

(75) Inventors: Zheng Shi, Shenzhen (CN); Chih-Chiang Chang, Taipei Hsien (TW)

(73) Assignees: Shenzhen Futaihong Precision Industry Co., Ltd., Shenzhen (CN); FIH (Hong Kong) Limited, Kowloon (HK)

( * ) Notice: Subject to any disclaimer, the term of this patent is extended or adjusted under 35 U.S.C. 154(b) by 1084 days.

(21) Appl. No.: 12/398,447

(22) Filed: Mar. 5, 2009

(65) Prior Publication Data

US 2009/0256727 A1 Oct. 15, 2009

(30) Foreign Application Priority Data

Apr. 14, 2008 (CN) .......................... 2008 1 0301118

(51) Int. Cl.
*H03M 11/00* (2006.01)

(52) U.S. Cl.
USPC ............. 341/22; 200/296; 200/341; 200/345; 340/11.1

(58) Field of Classification Search .................. 200/5 R, 200/5 A, 296, 341, 343, 344, 345; 340/11.1; 341/22
See application file for complete search history.

(56) References Cited

U.S. PATENT DOCUMENTS

2007/0199814 A1 * 8/2007 Kobayashi et al. ........... 200/520
2009/0139847 A1 * 6/2009 Yoon et al. .................... 200/5 A

FOREIGN PATENT DOCUMENTS

CN 1866438 A 11/2006
TW 572518 1/2004

OTHER PUBLICATIONS

Logitech deluxe 250 review of Mar. 2006 from retreivo.com.*

* cited by examiner

*Primary Examiner* — Tai T Nguyen
*Assistant Examiner* — Ojiako Nwugo
(74) *Attorney, Agent, or Firm* — Altis Law Group, Inc.

(57) ABSTRACT

A side keypad assembly includes a pressing surface, an opposite mating surface. The pressing surface includes a plurality of keypads protruded thereon. The mating surface includes a plurality of stepped columns protruded thereon corresponding to the plurality of keypads respectively and a plurality of separating protrusions corresponding to the conjoint portions between every two keypads respectively. The invention also provides a portable electronic device using the side keypad assembly.

14 Claims, 6 Drawing Sheets

SIDE KEYPAD ASSEMBLY AND PORTABLE ELECTRONIC DEVICE USING THE SAME

BACKGROUND

1. Technical Field

The present invention generally relates to side keypad assemblies and portable electronic devices using the side keypad assemblies.

2. Discussion of the Related Art

With the development of wireless communication and information processing technologies, portable electronic devices such as mobile phones and personal digital assistants (PDAs) are now in widespread use, and consumers may enjoy the full convenience of portable electronic devices almost anytime and anywhere. Portable electronic devices generally include some functional key assemblies mounted on the side to fulfill shortcut operations of e.g., playing music, taking photos, adjusting music volume, etc.

The functional key assembly often has a complex structure with multiple keys and is costly to produce. In addition, users may often mistakenly press the wrong key in use.

Therefore, there is a room for improvement within the art.

BRIEF DESCRIPTION OF THE DRAWING

Many aspects of the present side keypad assembly and portable electronic device using the side keypad assembly can be better understood with reference to the following drawings. The components in the drawings are not necessarily drawn to scale, the emphasis instead being placed upon clearly illustrating the principles of the present side keypad assembly and portable electronic device using the side keypad assembly. Moreover, in the drawings, like reference numerals designate corresponding parts throughout the plurality of views.

DETAILED DESCRIPTION OF THE EMBODIMENT

Figure 1:
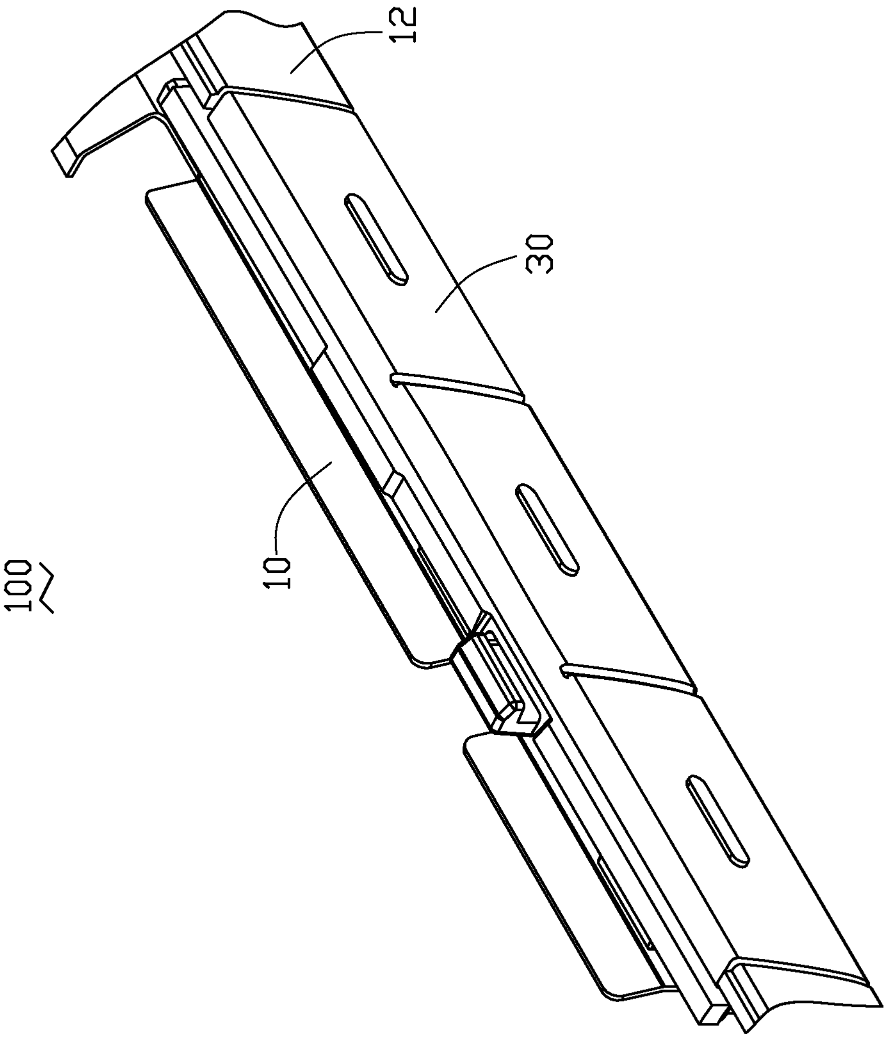
FIG. 1 shows a partial, isometric view of a side keypad assembly mounted on a housing of a portable electronic device, according to an exemplary embodiment.
Figure 3:
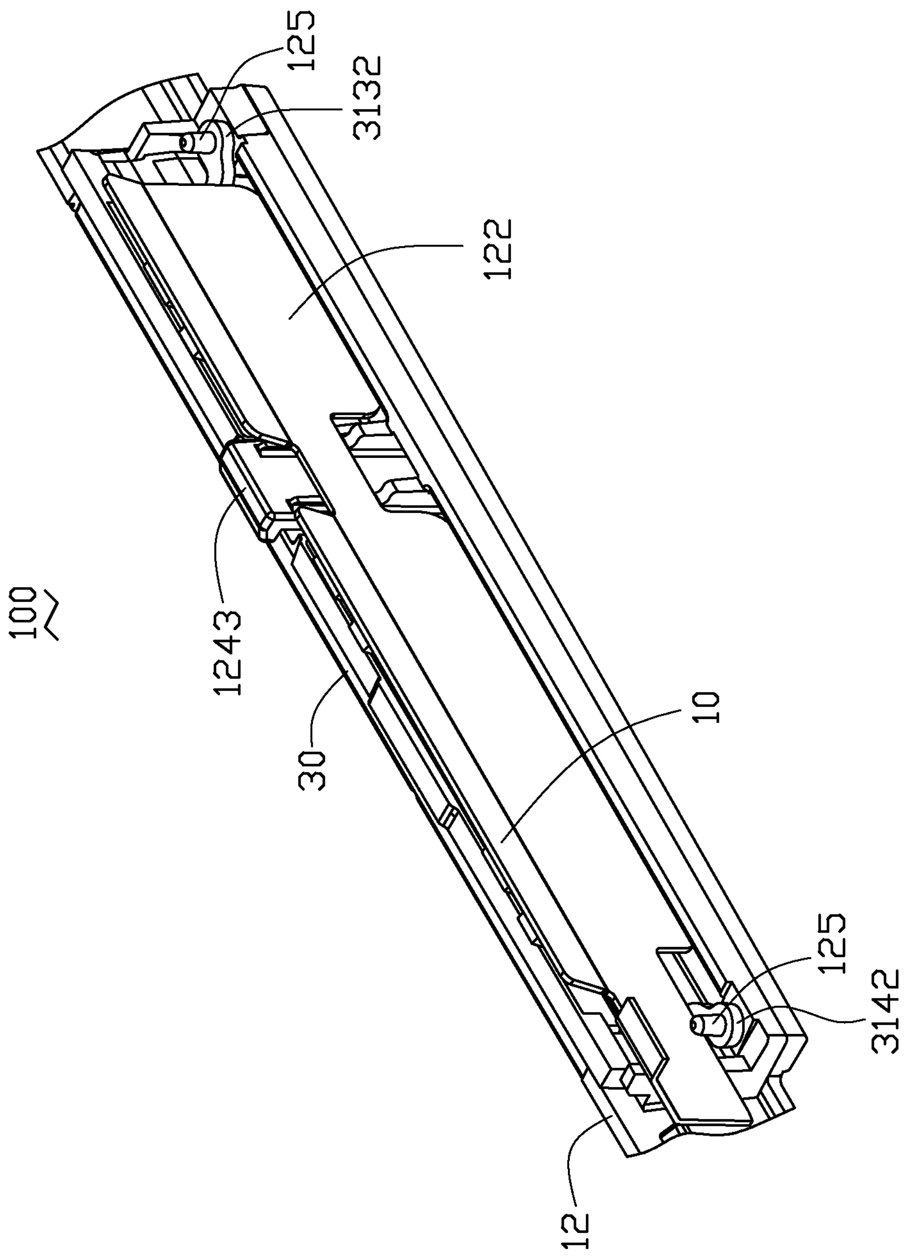
FIG. 3 is similar to FIG. 1, but viewed from another aspect.

Referring to FIG. 1 and FIG. 3, a portable electronic device 100 (only partially shown) such as a mobile phone includes a housing 10 having a sidewall 12 and a side keypad assembly 30. The side keypad assembly 30 can be detachably mounted to the side wall 12.

Figure 2:
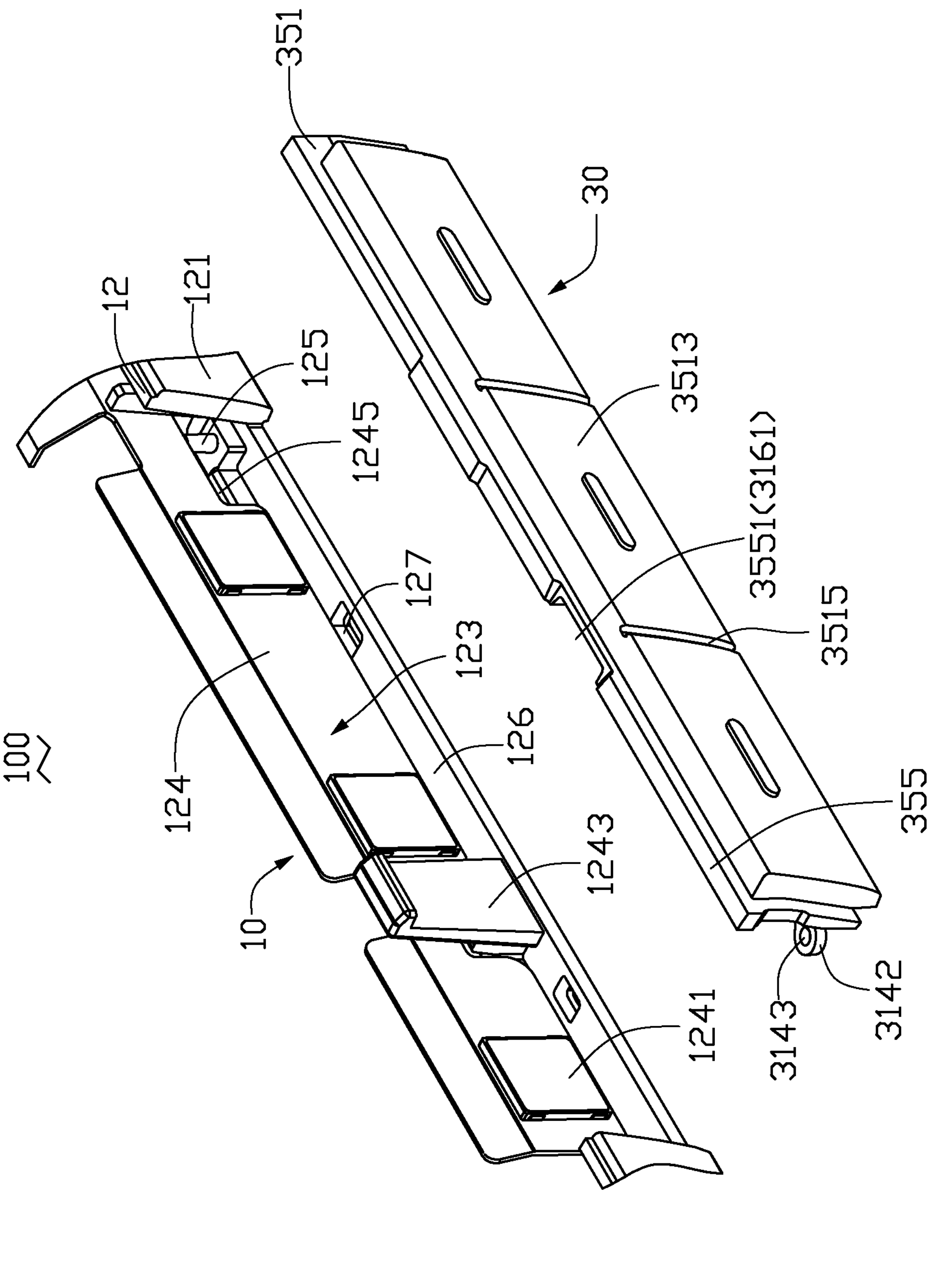
FIG. 2 shows an exploded isometric view of FIG. 1.
Figure 4:
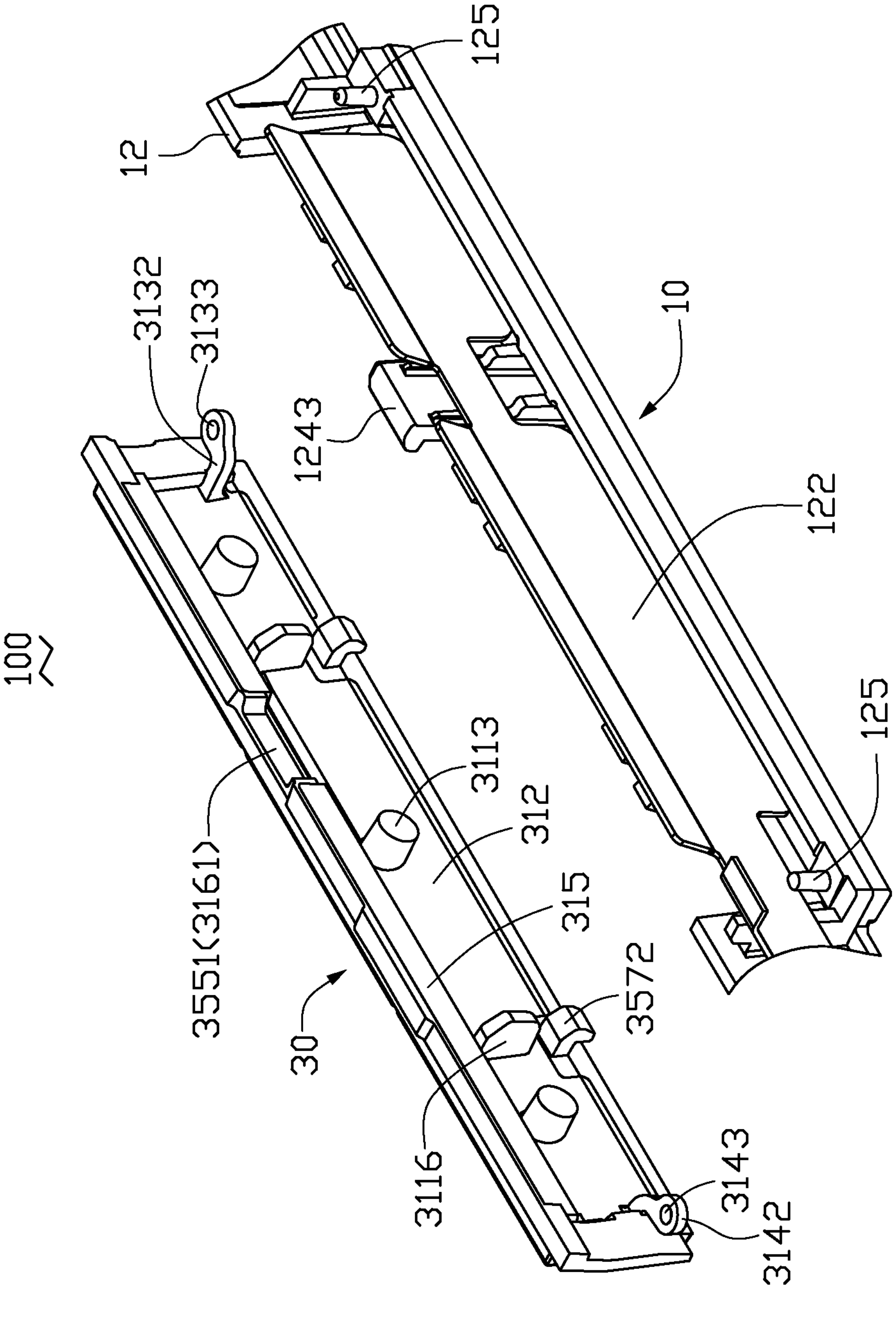
FIG. 4 is similar to FIG. 2, but viewed from another aspect.

Referring to FIG. 2 and FIG. 4, the side wall 12 includes an outer surface 121, an opposite inner surface 122, and a substantially rectangular assembling portion 123 recessed inside the outer surface 121 for assembling the side keypad assembly 30. The assembling portion 123 includes a bottom wall 124 and an assembling wall 126 substantially perpendicular to the bottom wall 124. The bottom wall 124 has three spaced-apart sensing contact pads 1241 and a latching block 1243 formed thereon. The sensing contact pads 1241 protruding from the bottom wall 124, and configured for electronically connecting with functional modules (not shown) within the portable electronic device 100 to control the functional modules by sending out an electronic signal. The latching block 1243 is substantially L-shaped protruding from the bottom wall 124 and located between adjacent two of the sensing contact pads 1241. Two ends of the bottom wall 124, parallel to the assembling wall 126, each defines a bar-shaped notch 1245 therethrough. Two ends of the inner surface 122, adjacent to the notches 1245, each has a positioning post 125 protruding therefrom. The assembling wall 126 defines two substantially rectangular latching holes 127 spaced from each other. The two latching holes 127 are located at two opposite sides of the latching block 1243.

Figure 5:
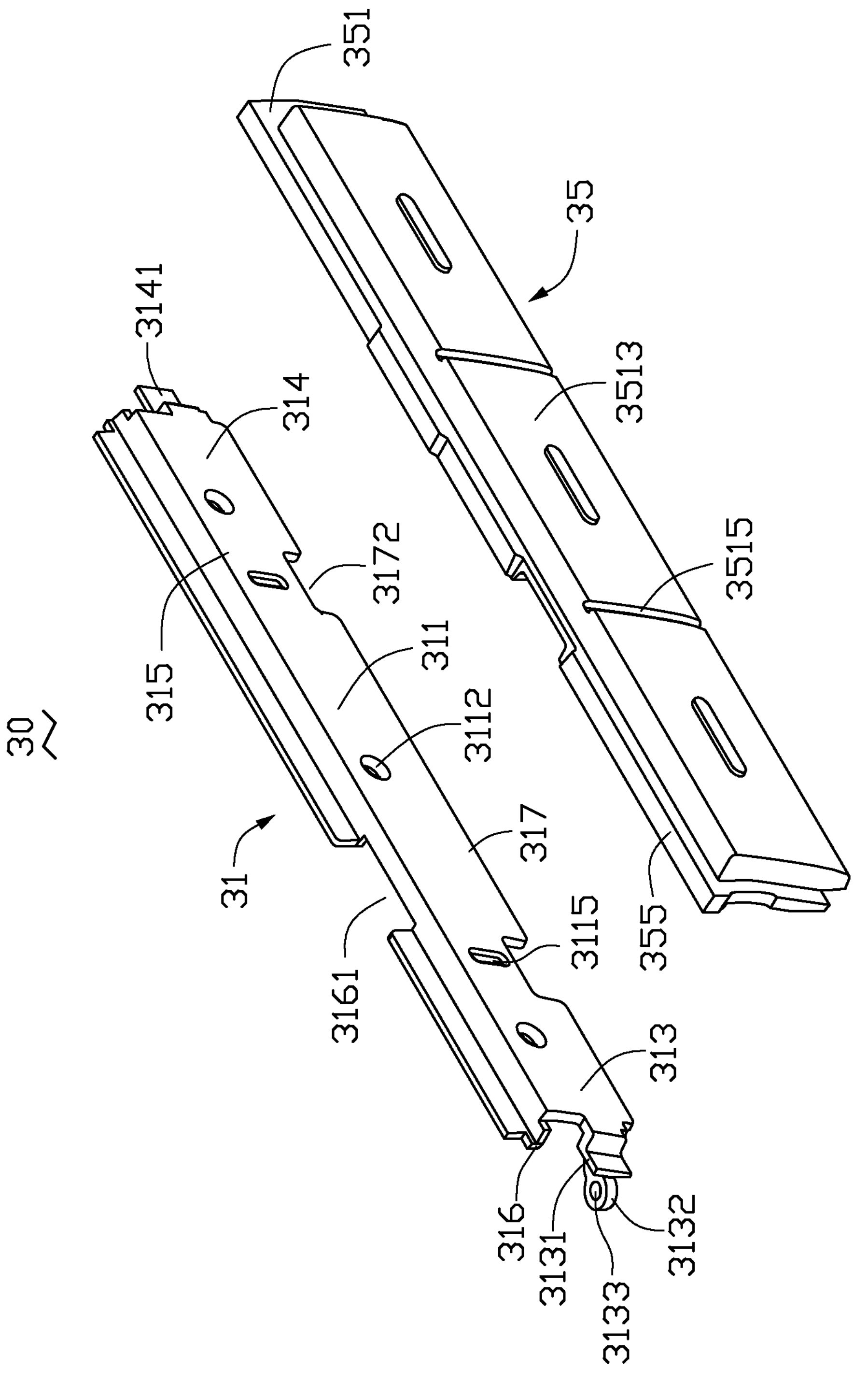
FIG. 5 shows an exploded view of the side keypad assembly in FIG. 1.
Figure 6:
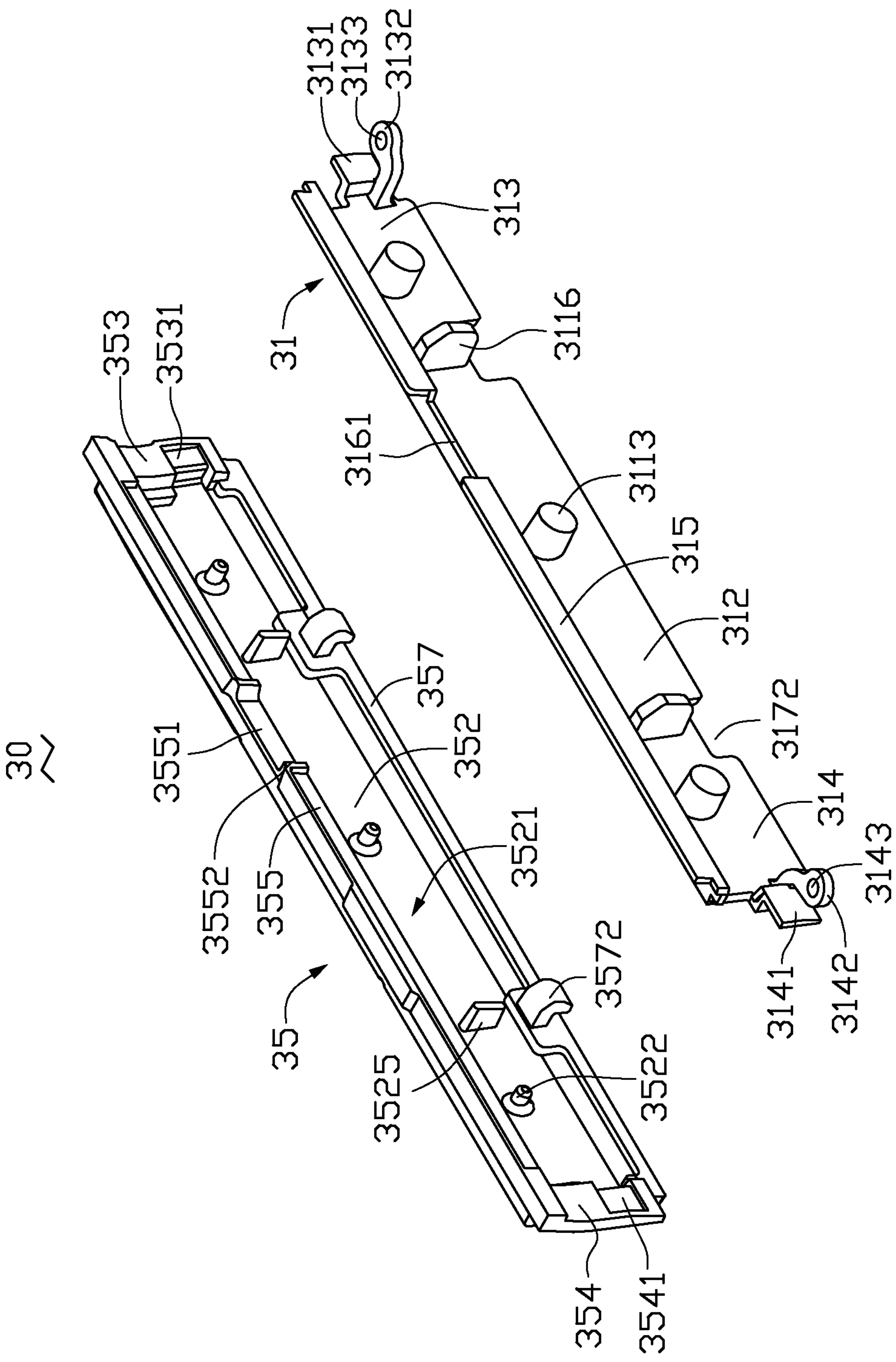
FIG. 6 is another exploded view of the side keypad assembly in FIG. 1.

Referring to FIG. 5 and FIG. 6, the side keypad assembly 30 includes a base panel 31 and a keypad panel 35 detachably assembled with the base panel 31. The base panel 31 is substantially rectangular and may be made of rubber materials or other soft plastic materials. The base panel 31 includes a first surface 311, an opposite second surface 312, a first latching end 313, an opposite second latching end 314, a first side portion 315, and an opposite second side portion 317. The first surface 311 forms three spaced blind holes 3112 and two spaced grooves 3115. Three projections 3113 and two protruding ribs 3116 are formed on the second surface 312 base panel. Each of the grooves 3115 is positioned between each two adjacent blind holes 3112.

The first latching end 313 includes a substantially L-shaped first latching portion 3131 extending toward the second surface 312. The second latching end 314 includes a substantially L-shaped second latching portion 3141 extending toward the second surface 312. The first latching portion 3131 includes a first fixing portion 3132 protruding therefrom. A first fixing hole 3133 is defined through the first fixing portion 3132 corresponding to one of the positioning posts 125 on the side wall 12. The second latching portion 3141 includes a second fixing portion 3142 protruding therefrom. A second fixing hole 3143 is defined through the second fixing portion 3142 corresponding to the other one of the positioning posts 125 on the side wall 12. The first side portion 315 includes a substantially L-shaped bending portion 316. The bending portion 316 defines a rectangular, through first gap 3161 corresponding to the latching block 1243 on the side wall 12. The second portion 317 defines two rectangular spaced, through second gaps 3172 adjacent to the two grooves 3115.

The keypad panel 35 is substantially rectangular and may be made of a plastic material. The keypad panel 35 includes a pressing surface 351, an opposite mating surface 352, a first assembling end 353, and an opposite second assembling end 354. The pressing surface 351 includes three spaced keys 3513 protruding therefrom and two separating slots 3515 between each two adjacent keys 3513. The mating surface 352 defines a substantially rectangular assembling groove 3521 and thus forms a first latching wall 355 and an opposite second latching wall 356 for latching with the base panel 31. The assembling groove 3521 includes three evenly spaced stepped columns 3522 corresponding to the blind holes 3112 and two spaced separating protrusions 3525 protruding corresponding to the grooves 3115 in the base panel 31.

The first assembling end 353 concaves a first rectangular groove 3531 communicating with the assembling groove 3521. The second assembling end 354 concaves a second rectangular groove 3541 communicating with the assembling groove 3521. The first latching wall 355 recesses a gap portion 3551 to communicate the assembling groove 3521. Two opposite sides of the gap portion 3551 protrude two resisting protrusion 3552 respectively for latching into the first rectangular gap 3161. The second latching wall 357 includes two spaced latching hooks 3572 for latching into the two grooves 3115 respectively.

Referring now to FIGS. 2 and 4-6, during assembly of the side keypad assembly 30, the keypad panel 35 latches the base panel 31. The first surface 311 of the base panel 31 is assembled into the assembling groove 3521, and the bending portion 316 can tightly resist the first latching wall 355. The gap portion 3551 and the two resisting protrusions of the keypad panel 35 latch into the first rectangular gap 3161 of the base panel 31. At the same time, the stepped columns 3522 and the separating protrusions 3535 are inserted into the blind holes 3112 and the grooves 3115 of the base panel 31. The latching blocks 3572 penetrate through the second gaps 3172 of the base panel 31. The first latching portion 3131 and the second latching portion 3141 respectively insert and latch into the first rectangular groove 3531 and the second rectangular groove 3541.

Referring to FIGS. 1 and 3, to assemble the side keypad assembly 30 to the housing 10, the first fixing portion 3132 and the second fixing portion 3142 penetrate through the notches 1245 of the housing 10 to position the two positioning posts 125 within the first fixing hole 3133 and the second fixing hole 3143. At this time, the column projections 3113 resist the sensing contact pads 1241, and the protruding ribs 3116 resist the bottom wall 124 of the side wall 12. The latching block 1243 latches the gap portion 3551 and the two latching hooks 3527 latch the two latching holes 127.

The side keypad assembly 30 can avoid errors in operating the portable electronic device 100 as following. When pressing the key 3513 of the side keypad assembly 35, the key 3513 urges the column projection 3113 of the base panel 31 to move to contact with the sensing contact pad 1241.

It is to be understood that the base panel 31 can be integrally formed with the keypad panel 35 e.g., by double injecting molding technology.

It is also to be understood, however, that even though numerous characteristics and advantages of the present invention have been set forth in the foregoing description, together with details of the structure and function of the present invention, the disclosure is illustrative only, and changes may be made in detail, especially in matters of shape, size, and arrangement of parts within the principles of present invention to the full extent indicated by the broad general meaning of the terms in which the appended claims are expressed.

What is claimed is:

1. A side keypad assembly for a portable electronic device, comprising:

a keypad panel and a base panel assembled with the keypad panel; the keypad panel comprising:

a pressing surface comprising a plurality of keypads protruding therefrom; and a mating surface opposite to the pressing surface and assembled with the base panel, the mating surface comprising a plurality of stepped protruding columns corresponding to the plurality of keypads, and a plurality of separating protrusions located between each two adjacent keypads, the separating protrusions protruding from the mating surface along a direction toward the base panel;

wherein the base panel comprises a first surface, an opposite second surface; the first surface comprises a plurality of blind holes, and a plurality of grooves corresponding to the stepped columns and separating protrusions respectively, thereby forming a plurality of column projections and a plurality of protruding ribs on the second surface of the base panel; the stepped columns and the separating protrusions respectively latch with the blind holes and grooves of the base panel;

the mating surface further comprises an assembling groove, a first side wall, and an opposite second side wall; the base panel is assembled within the assembling groove.

2. The side keypad assembly as claimed in claim 1, wherein the base panel further comprises a first latching end, an opposite second latching end, a first latching portion and a second latching portion, both the first and second latching portion bend toward the second surface; the keypad panel further comprises a first assembling end, a second assembling end opposite the first assembling end, a first groove and a second groove communicating with the assembling groove, both the first and the second latching portions latch with the first rectangular groove and the second rectangular groove of the keypad panel respectively.

3. The side keypad assembly as claimed in claim 2, wherein the base panel further comprises a first side portion and an opposite second side portion, the first side portion comprises a bending portion extending therefrom toward the second surface, the bending portion resists the first side wall of the mating surface of the keypad panel.

4. The side keypad assembly as claimed in claim 3, wherein the bending portion defines a first gap therethrough, the first side wall defines a gap portion therethrough toward the mating surface of the keypad panel that corresponding to the first gap; the gap portion communicates with the assembling groove, and the two side walls of the gap portion includes a resisting protrusion respectively for latching with the first gap.

5. The side keypad assembly as claimed in claim 1, wherein the base panel being integrally formed with the keypad panel by double injecting molding technology.

6. A portable electronic device comprising:

a housing; and a side keypad assembly detachably assembled with the housing, the side keypad assembly comprising:

a keypad panel and a base panel assembled with the keypad panel; the keypad panel comprising:

a pressing surface comprising a plurality of keypads protruding therefrom; and a mating surface opposite to the pressing surface and assembled with the base panel, the mating surface comprising a plurality of stepped protruding columns corresponding to the plurality of keypads, and a plurality of separating protrusions located between each two adjacent keypads, the separating protrusions protruding from the mating surface along a direction toward the base panel;

wherein the base panel comprises a first surface, an opposite second surface; the first surface comprises a plurality of blind holes and a plurality of grooves corresponding to the plurality of stepped columns and a plurality of separating protrusions respectively, and a plurality of column projections and a plurality of protruding ribs on the second surface of the base panel; the stepped columns and the separating protrusions latch with the blind holes and grooves of the base panel respectively;

the housing includes a side wall and a rectangular assembling portion concaved on the outside surface of the side wall, the assembling portion includes a bottom wall; the bottom wall comprises a plurality of sensing contact pads protruding therefrom that correspond to the keypads respectively; the side keypad assembly is assembled within the assembling portion, the column projections and the protruding ribs are resisted on the sensing contact pads and bottom wall respectively.

7. The portable electronic device as claimed in claim 6, wherein the mating surface comprises an assembling groove concaved thereon and, forming a first side wall and an opposite second side wall; the base panel is assembled within the assembling groove.

8. The portable electronic device as claimed in claim 7, wherein the base panel further comprises a first latching end, an opposite second latching end, a first latching portion and a second latching portion bending toward the second surface from the first latching end and the second latching end respectively; the keypad panel further comprises a first assembling end, a second assembling end opposite the first assembling end; a first groove and a second groove concave on the mating surface of the first assembling end and the second assembling end respectively that communicate with the assembling groove; the first latching portion and the second latching portion of the base panel latch with the first groove and the second groove of the keypad panel respectively.

9. The portable electronic device as claimed in claim 8, wherein the two ends of the bottom wall each defines a notch and there opposite to the bottom wall protrudes a positioning post corresponding to each notch; the first latching portion comprising a first fixing portion and a first fixing hole defined through the first fixing portion; the second latching portion comprising a second fixing portion and a second fixing hole defined through the second fixing portion; the two positioning posts are inserted into the first fixing portion and the second fixing portion respectively.

10. A side keypad assembly for a portable electronic device, comprising:

a pressing surface comprising a plurality of keypads protruding therefrom; and a mating surface opposite to the pressing surface comprising a plurality of stepped protruding columns corresponding to the plurality of keypads, and a plurality of separating protrusions located between each two adjacent keypads;

a keypad panel and a base panel assembled with the keypad panel, the pressing surface and the mating surface respectively defined on the opposite surfaces of the keypad panel; wherein the base panel comprises a first surface, an opposite second surface; the first surface comprises a plurality of blind holes, and a plurality of grooves corresponding to the stepped columns and separating protrusions respectively, thereby forming a plurality of column projections and a plurality of protruding ribs on the second surface of the base panel; the stepped columns and the separating protrusions respectively latch with the blind holes and grooves of the base panel; the mating surface comprises an assembling groove, a first side wall, and an opposite second side wall; the base panel is assembled within the assembling groove.

11. The side keypad assembly as claimed in claim 10, wherein the base panel further comprises a first latching end, an opposite second latching end, a first latching portion and a second latching portion, both the first and second latching portion bend toward the second surface; the keypad panel further comprises a first assembling end, a second assembling end opposite the first assembling end, a first groove and a second groove communicating with the assembling groove, both the first and the second latching portions latch with the first rectangular groove and the second rectangular groove of the keypad panel respectively.

12. The side keypad assembly as claimed in claim 11, wherein the base panel further comprises a first side portion and an opposite second side portion, the first side portion comprises a bending portion extending therefrom toward the second surface, the bending portion resists the first side wall of the mating surface of the keypad panel.

13. The side keypad assembly as claimed in claim 12, wherein the bending portion defines a first gap therethrough, the first side wall defines a gap portion therethrough toward the mating surface of the keypad panel that corresponding to the first gap; the gap portion communicates with the assembling groove, and the two side walls of the gap portion includes a resisting protrusion respectively for latching with the first gap.

14. The side keypad assembly as claimed in claim 10, wherein the base panel being integrally formed with the keypad panel by double injecting molding technology.

* * * * *